(12) United States Patent
Jin et al.

(10) Patent No.: US 12,408,450 B2
(45) Date of Patent: Sep. 2, 2025

(54) CMOS IMAGE SENSOR

(71) Applicant: SAMSUNG ELECTRONICS CO., LTD., Suwon-si (KR)

(72) Inventors: Younggu Jin, Suwon-si (KR); Seunghyun Lee, Suwon-si (KR); Youngchan Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 436 days.

(21) Appl. No.: 18/094,473

(22) Filed: Jan. 9, 2023

(65) Prior Publication Data
US 2023/0307482 A1  Sep. 28, 2023

(30) Foreign Application Priority Data
Mar. 23, 2022  (KR) .................. 10-2022-0035888

(51) Int. Cl.
*H10F 39/18*  (2025.01)
*H10F 39/00*  (2025.01)

(52) U.S. Cl.
CPC ......... *H10F 39/18* (2025.01); *H10F 39/8067* (2025.01); *H10F 39/807* (2025.01); *H10F 39/811* (2025.01)

(58) Field of Classification Search
CPC ........................... H10F 39/8067; H10F 39/18
See application file for complete search history.

(56) References Cited

U.S. PATENT DOCUMENTS

| | | | |
|---|---|---|---|
| 9,443,899 B1* | 9/2016 | Liu | ............. H10F 39/18 |
| 10,325,947 B2 | 6/2019 | Velichko et al. | |
| 10,373,997 B2 | 8/2019 | Choi et al. | |
| 10,504,952 B2 | 12/2019 | Cheng et al. | |
| 10,797,090 B2 | 10/2020 | Perkins et al. | |
| 10,833,117 B2 | 11/2020 | Shim | |
| 2014/0327051 A1 | 11/2014 | Ahn et al. | |
| 2016/0211306 A1* | 7/2016 | Choi | ............. H10F 39/18 |
| 2017/0047367 A1* | 2/2017 | Lee | ............. H10F 39/8053 |
| 2020/0058684 A1 | 2/2020 | Wu et al. | |
| 2020/0227455 A1* | 7/2020 | Lee | ............. H10F 39/803 |
| 2020/0243578 A1* | 7/2020 | Pyo | ............. H10F 39/8053 |
| 2021/0134863 A1 | 5/2021 | Suzuki | |
| 2021/0134869 A1 | 5/2021 | Jang et al. | |

FOREIGN PATENT DOCUMENTS

| | | |
|---|---|---|
| CN | 111294493 | 6/2020 |
| CN | 112331687 | 2/2021 |
| KR | 10-2011-0076613 | 7/2011 |

* cited by examiner

*Primary Examiner* — Mounir S Amer
(74) *Attorney, Agent, or Firm* — Morgan, Lewis & Bockius LLP

(57) ABSTRACT

A CMOS image sensor includes: a substrate including a plurality of unit pixel regions. The substrate includes: a first surface configured to receive light; a second surface opposite to the first surface; a deep device isolation portion disposed in the substrate and configured to isolate the plurality of unit pixel regions from each other, wherein the deep device isolation portion extends from the first surface toward the second surface and has a first depth measured from the first surface; a photoelectric conversion portion formed in the substrate in each of the plurality of unit pixel regions; and a first vertical reflection structure disposed in each of the plurality of unit pixel regions of the substrate and surrounded by the deep device isolation portion in a plan view.

20 Claims, 17 Drawing Sheets

CMOS IMAGE SENSOR

CROSS-REFERENCE TO RELATED APPLICATION

This U.S. non-provisional patent application claims priority under 35 U.S.C. § 119 to Korean Patent Application No. 10-2022-0035888, filed on Mar. 23, 2022, in the Korean Intellectual Property Office, the disclosure of which is incorporated by reference herein in its entirety.

TECHNICAL FIELD

Exemplary embodiments of the present inventive concept relate to a complementary metal-oxide-semiconductor (CMOS) image sensor.

DISCUSSION OF RELATED ART

An image sensor may convert an optical image into electrical signals. As computer and communication industries are developing, there is an increasing demand for high-performance image sensors in various fields such as a digital camera, a camcorder, a personal communication system (PCS), a game console, a security camera, a medical micro camera, etc.

Image sensors may be categorized as either charge coupled device (CCD) image sensors or complementary metal-oxide-semiconductor (CMOS) image sensors. The CMOS image sensor may be driven and realized as a single chip where a signal processing circuit and an image sensing part are integrated. Thus, a size of the CMOS image sensor may be reduced. In addition, the CMOS image sensor may have low power consumption and may be easily applied to a product having a limited battery capacity. Furthermore, the CMOS image sensor may be manufactured using a CMOS process technique, thereby reducing the manufacturing cost of the CMOS image sensor. As a result, the CMOS image sensor may have high resolution by the use of the CMOS process technique.

SUMMARY

Exemplary embodiments of the present inventive concepts provide a CMOS image sensor capable of preventing cross-talk and increasing quantum efficiency (QE).

According to an exemplary embodiment of the present inventive concept, a CMOS image sensor comprises: a substrate including a plurality of unit pixel regions. The substrate includes: a first surface configured to receive light; a second surface opposite to the first surface; a deep device isolation portion disposed in the substrate and configured to isolate the plurality of unit pixel regions from each other, wherein the deep device isolation portion extends from the first surface toward the second surface and has a first depth measured from the first surface; a photoelectric conversion portion formed in the substrate in each of the plurality of unit pixel regions; and a first vertical reflection structure disposed in each of the plurality of unit pixel regions of the substrate and surrounded by the deep device isolation portion in a plan view, wherein the first vertical reflection structure extends from the first surface toward the second surface and has a second depth measured from the first surface, wherein the second depth is equal to or greater than the first depth, and wherein a bottommost surface of the first vertical reflection structure is higher than an uppermost portion of the photoelectric conversion portion with respect to the first surface.

According to an exemplary embodiment of the present inventive concept, a CMOS image sensor comprise: a substrate including a plurality of unit pixel regions. The substrate includes: a first surface; a second surface opposite to the first surface and configured to receive light, a deep device isolation portion disposed in the substrate and configured to isolate the plurality of unit pixel regions from each other; a photoelectric conversion portion formed in the substrate in each of the plurality of unit pixel regions; a first vertical reflection structure disposed in each of the plurality of unit pixel regions in the substrate and surrounded by the deep device isolation portion in a plan view; and a second vertical reflection structure disposed in each of the plurality of unit pixel regions and surrounded by the first vertical reflection structure in the plan view, wherein the deep device isolation portion is spaced apart from the first surface, and wherein the first vertical reflection structure and the second vertical reflection structure are disposed inside the photoelectric conversion portion when viewed in the plan view.

According to an exemplary embodiment of the present inventive concept, a CMOS image sensor comprises: a substrate including a plurality of unit pixel regions. The substrate includes: a first surface; a second surface opposite to the first surface and configured to receive light; a deep device isolation portion disposed in the substrate and configured to isolate the plurality of unit pixel regions from each other; a photoelectric conversion portion formed in the substrate in each of the plurality of unit pixel regions; a first vertical reflection structure disposed in the substrate and surrounded by the deep device isolation portion in a plan view; a second vertical reflection structure disposed in the substrate and surrounded by the first vertical reflection structure in the plan view; a transfer gate and a floating diffusion region disposed on the first surface; an interlayer insulating layer disposed on the first surface, wherein the interlayer insulating layer covers the first surface, the transfer gate, and the floating diffusion region; and interconnection lines disposed in the interlayer insulating layer, wherein the deep device isolation portion extends from the second surface toward the first surface and has a first depth measured from the second surface, wherein the first vertical reflection structure extends from the second surface toward the first surface and has a second depth measured from the second surface, wherein the second depth is equal to or greater than the first depth, and wherein a level of a bottommost surface of the first vertical reflection structure and a level of a bottommost surface of the second vertical reflection structure are higher than a level of an uppermost portion of the photoelectric conversion portion.

DETAILED DESCRIPTION OF THE EMBODIMENTS

Figure 1:
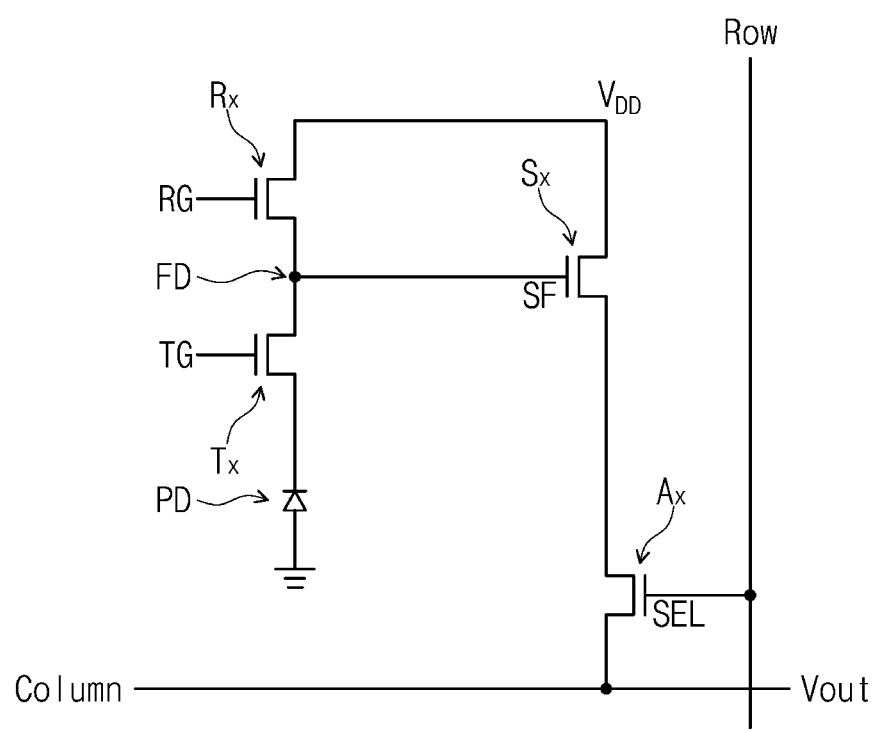
FIG. 1 is a circuit diagram illustrating a pixel circuit of a CMOS image sensor according to an exemplary embodiment of the present inventive concept.

Exemplary embodiments of the present inventive concept will now be described more fully with reference to the accompanying drawings. The same reference numerals or the same reference designators may denote the same elements or components throughout the specification and the drawings.

FIG. 1 is a circuit diagram illustrating a pixel circuit of a CMOS image sensor according to an exemplary embodiment of the present inventive concept.

Referring to FIG. 1, each pixel of an image sensor may include a photoelectric conversion element PD, a transfer transistor Tx, a source follower transistor Sx, a reset transistor Rx, and a selection transistor Ax. The transfer transistor Tx, the source follower transistor Sx, the reset transistor Rx, and the selection transistor Ax may include a transfer gate TG, a source follower gate SF, a reset gate RG, and a selection gate SEL, respectively.

The photoelectric conversion element PD may be a photodiode including an n-type dopant region and a p-type dopant region. A floating diffusion region FD may function as a drain of the transfer transistor Tx. The floating diffusion region FD may also function as a source of the reset transistor Rx. The floating diffusion region FD may be electrically connected to the source follower gate SF of the source follower transistor Sx. In other words, the floating diffusion region FD may be directly connected to each of the reset transistor Rx, transfer transistor Tx, and selection transistor Ax. The source follower transistor Sx may be connected to the selection transistor Ax.

Hereinafter, an operation of the image sensor will be described with reference to FIG. 1. First, the reset transistor Rx may be turned-on to discharge charges remaining in the floating diffusion region FD. Thereafter, when the reset transistor Rx is turned-off and the transfer transistor Tx is turned-on, charges generated by light in the photoelectric conversion element PD may be transferred into the floating diffusion region FD. A gate bias of the source follower transistor Sx may be changed in proportion to the amount of the transferred charges, and thus a source potential of the source follower transistor Sx may be changed. The changed potential (e.g., $V_{OUT}$) may be transferred to a column line through the selection transistor Ax turned-on by a signal provided through the row line.

Figure 2:
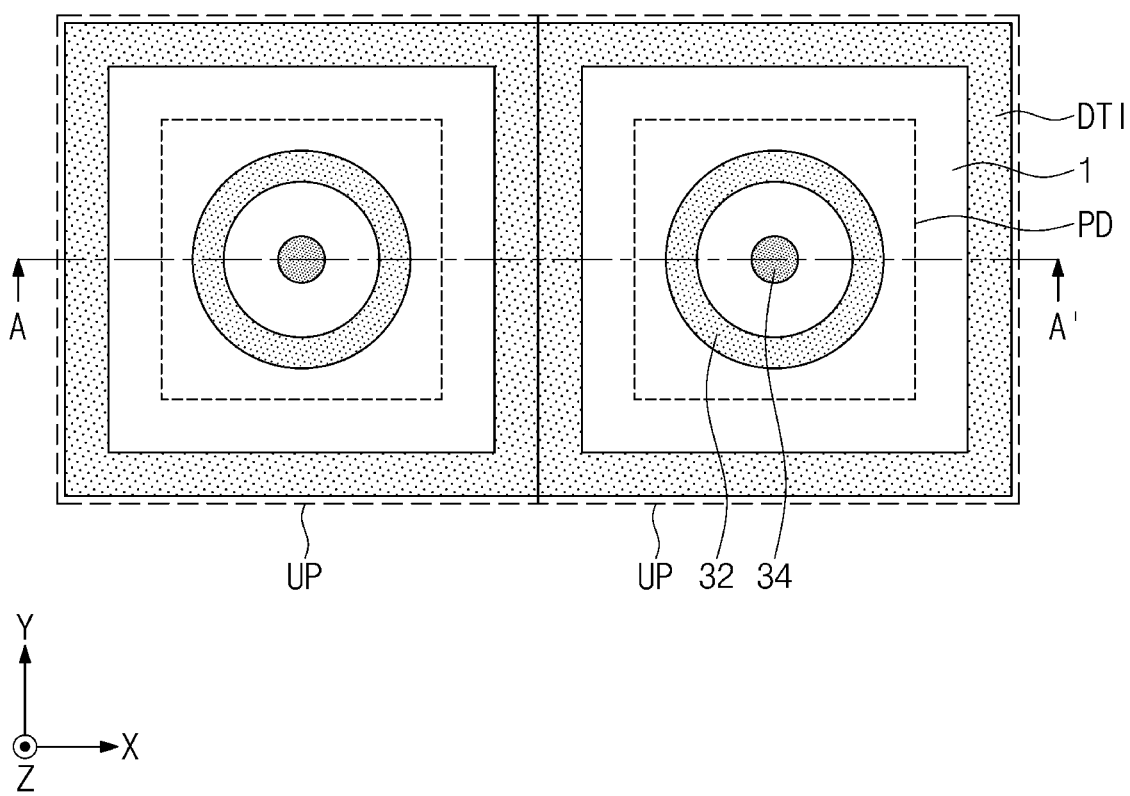
FIG. 2 is a plan view illustrating a CMOS image sensor according to an exemplary embodiment of the present inventive concept.
Figure 3A:
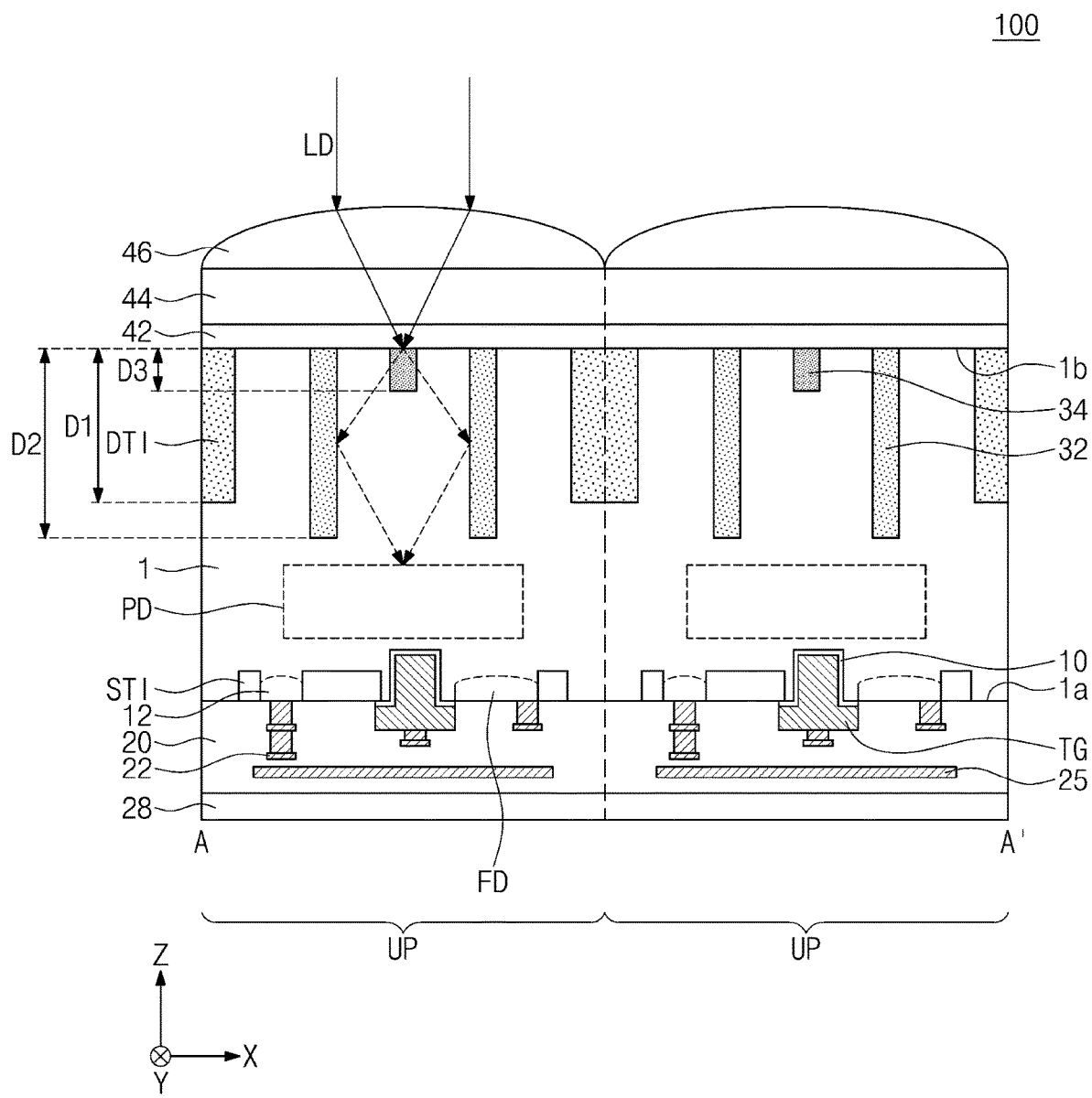
FIGS. 3A and 3B are cross-sectional views taken along a line A-A' of FIG. 2 illustrating the CMOS image sensor according to an exemplary embodiment of the present inventive concept.
Figure 3B:
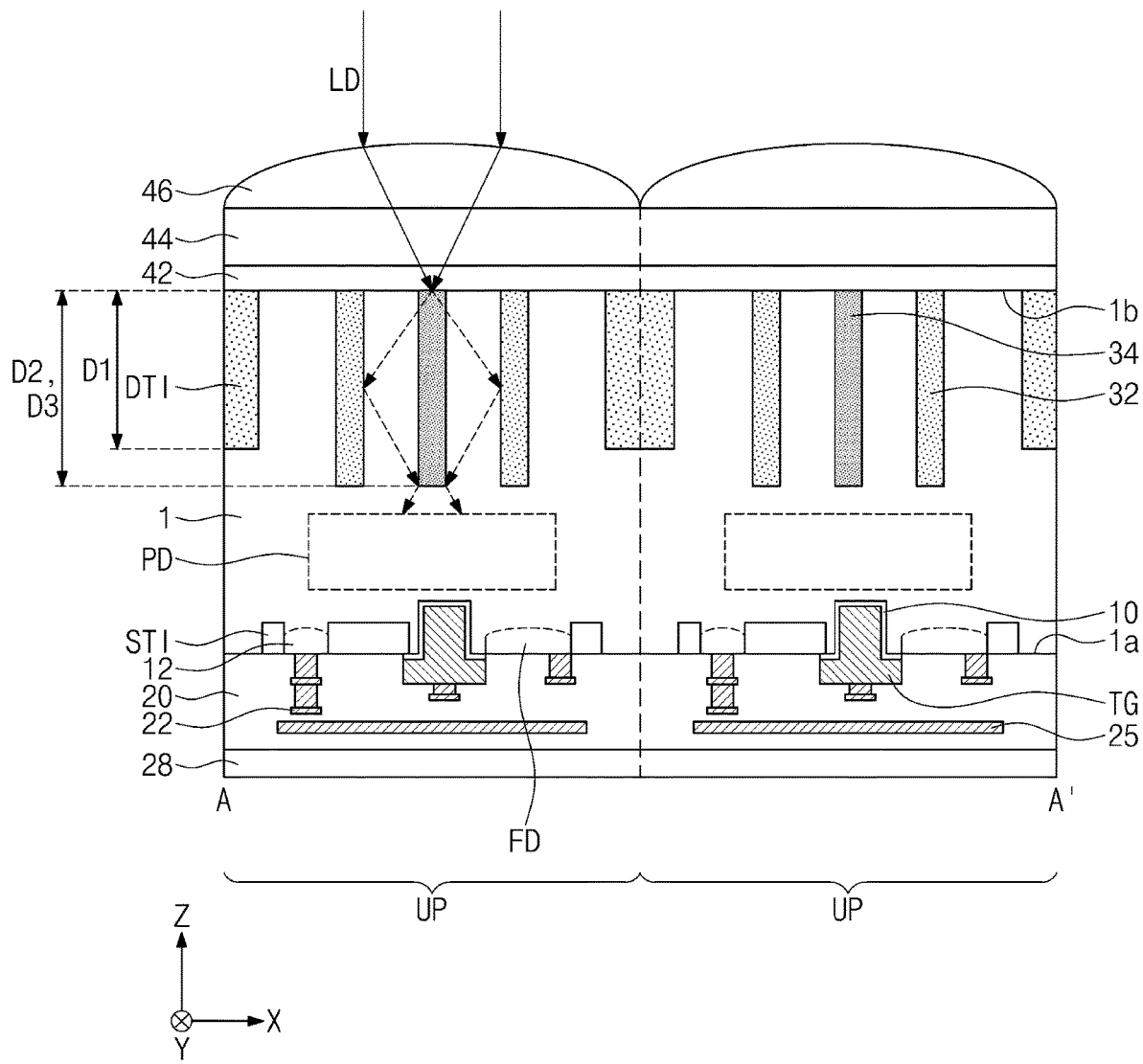

FIG. 2 is a plan view illustrating a CMOS image sensor according to an exemplary embodiment of the present inventive concept. FIGS. 3A and 3B are cross-sectional views taken along a line A-A' of FIG. 2 illustrating CMOS image sensors according to an exemplary embodiment of the present inventive concept.

Referring to FIGS. 2, 3A, and 3B, a substrate 1 including unit pixel regions UP may be provided. The substrate 1 may include a first surface 1a and a second surface 1b which are opposite to each other. Light may be incident through the second surface 1b. A shallow device isolation layer STI may be disposed in the first surface 1a to define active regions. Alternatively, a device isolation region doped with dopants may be disposed instead of the shallow device isolation layer STI. The substrate 1 may be a single-crystalline silicon substrate, a silicon-on-insulator (SOI) substrate, or a silicon epitaxial layer. The substrate 1 may be doped with dopants having a first conductivity type. For example, the first conductivity type may be a P-type.

In the present inventive concept, a first direction X may mean a direction parallel to a surface (e.g., the first surface 1a) of the substrate 1. A second direction Y may mean a direction which is parallel to the surface (e.g., the first surface 1a) of the substrate 1 and perpendicularly intersects the first direction X. A third direction Z may mean a direction which is perpendicular to the surface (e.g., the first surface 1a) of the substrate 1.

In each of the unit pixel regions UP, a photoelectric conversion portion PD may be disposed in the substrate 1 (e.g., between the first surface 1a and second surface 1b of the substrate 1). The photoelectric conversion portion PD may be a region doped with dopants having a second conductivity type opposite to the first conductivity type. For example, the second conductivity type may be an N-type. N-type dopants doped in the photoelectric conversion portion PD may form a PN junction with P-type dopants doped in the substrate 1 therearound constituting a photodiode. An uppermost portion of the photoelectric conversion portion PD may be a boundary portion, located at the top in the third direction Z, where the substrate 1 and the photoelectric conversion portion PD are adjacent to each other.

A transfer gate TG, a floating diffusion region FD and a ground region 12 may be disposed at the first surface 1a of the substrate 1. The transfer gate TG may have a vertical-type gate shape including a portion extending into the substrate 1. In other words, the transfer gate TG may include a first portion in the substrate 1 and a second portion protruded from the first surface 1a of the substrate 1. Alternatively, the transfer gate TG may have a flat-type gate shape disposed on the first surface 1a of the substrate 1. A gate insulating layer 10 may be disposed between the transfer gate TG and the substrate 1. The floating diffusion region FD may be doped with, for example, N-type dopants. The ground region 12 may be doped with, for example, P-type dopants. A doping concentration of the ground region 12 may be higher than a doping concentration of the P-type dopants of the substrate 1.

Light may be incident into the substrate 1 through the second surface 1b of the substrate 1. Electron-hole pairs may be generated at the PN junction by the incident light LD. The generated electrons may be accumulated in the photoelectric conversion portion PD. When a voltage is applied to the transfer gate TG, a transistor including the transfer gate TG may be turned-on to transfer the electrons into the floating diffusion region FD. The electrons accumulated in the floating diffusion region FD may be transferred to the outside of the unit pixel region UP through other transistors (e.g., the source follower transistor Sx, the reset transistor Rx, and the selection transistor Ax) constituting the pixel of FIG. 1 and interconnection lines. Multi-layered interlayer insulating layers 20 and interconnection lines 22 may be disposed on the first surface 1a of the substrate 1. The interlayer insulating layer 20 may be covered with a passivation layer 28. A reflection portion 25 may be disposed in the interlayer insulating layer 20. The reflection portion 25 may have a plate shape occupying a portion of each of the unit pixel regions UP when viewed in a plan view. The reflection portion 25 may be formed of a portion of the interconnection lines 22 or may be formed of an additional metal layer.

A deep device isolation portion DTI may be disposed in the substrate 1 to isolate the unit pixel regions UP from each other. The deep device isolation portion DTI may extend from the second surface 1b of the substrate 1 toward the first surface 1a of the substrate 1 and may have a first depth D1 measured from the second surface 1b of the substrate 1. In other words, a length of the deep device isolation portion DTI in the third direction Z may be the first depth D1. In some embodiments, the deep device isolation portion DTI may be spaced apart from the first surface 1a. The deep device isolation portion DTI may have a mesh or grid shape when viewed in a plan view. The deep device isolation portion DTI may include an oxide-based or nitride-based material. For example, the deep device isolation portion DTI may include an insulating material such as a silicon oxide layer, a silicon nitride layer, and/or a silicon oxynitride layer. In addition, the deep device isolation portion DTI may include a polysilicon pattern therein. A voltage may be applied to the polysilicon pattern to reduce a dark current and a white spot. In certain embodiments, the deep device isolation portion DTI may include a high-k dielectric material therein, instead of the polysilicon pattern. The high-k dielectric material may be hafnium oxide (HfO$_2$), tantalum oxide (Ta$_2$O$_5$), or aluminum oxide (Al$_2$O$_3$).

A first vertical reflection structure 32 may be disposed in the substrate 1 and may be surrounded by the deep device isolation portion DTI in a plan view. The first vertical reflection structure 32 may be disposed inside the photoelectric conversion portion PD when viewed in a plan view. The first vertical reflection structure 32 may be spaced apart from the photoelectric conversion portion PD in the third direction Z. The first vertical reflection structure 32 may have a circular ring shape, an elliptical ring shape, or a polygonal ring shape when viewed in a plan view.

The first vertical reflection structure 32 may extend from the second surface 1b of the substrate 1 toward the first surface 1a of the substrate 1 and may have a second depth D2 measured from the second surface 1b of the substrate 1. In other words, a length of the first vertical reflection structure 32 in the third direction Z may be the second depth D2. The second depth D2 may be equal to or greater than the first depth D1. A level of a bottommost surface of the first vertical reflection structure 32 may be higher than a level of the uppermost portion of the photoelectric conversion portion PD.

The first vertical reflection structure 32 may include a material having a refractive index lower than that of the substrate 1. The first vertical reflection structure 32 may include an oxide-based or nitride-based material. For example, the first vertical reflection structure 32 may include an insulating material such as a silicon oxide layer, a silicon nitride layer, and/or a silicon oxynitride layer. In addition, the first vertical reflection structure 32 may include a high-k dielectric material therein. The high-k dielectric material may be hafnium oxide (HfO$_2$), tantalum oxide (Ta$_2$O$_5$), or aluminum oxide (Al$_2$O$_3$). The first vertical reflection structure 32 may include the same material as the deep device isolation portion DTI. Alternatively, the material of the first vertical reflection structure 32 may be different from the material of the deep device isolation portion DTI.

A second vertical reflection structure 34 may be disposed in each of the unit pixel regions UP and may be surrounded by the first vertical reflection structure 32 in a plan view. The second vertical reflection structure 34 may be disposed substantially in the center of each of the unit pixel regions UP in a plan view. The second vertical reflection structure 34 may be disposed inside the first vertical reflection structure 32 when viewed in a plan view. The second vertical reflection structure 34 may be disposed inside the photoelectric conversion portion PD when viewed in a plan view. The second vertical reflection structure 34 may be spaced apart from the photoelectric conversion portion PD in the third direction Z. The second vertical reflection structure 34 may have a circular shape, an elliptical shape, or a polygonal shape when viewed in a plan view. The second vertical reflection structure 34 may be coaxial with the first vertical reflection structure 32.

The second vertical reflection structure 34 may extend from the second surface 1b of the substrate 1 toward the first surface 1a of the substrate 1 and may have a third depth D3 measured from the second surface 1b of the substrate 1. In other words, the third depth D3 may be a length of the second vertical reflection structure 34 in the third direction Z. The third depth D3 may be less than the first depth D1. Alternatively, as illustrated in FIG. 3B, the third depth D3 may be equal to or greater than the first depth D1. A level of a bottommost surface of the second vertical reflection structure 34 may be higher than the level of the uppermost portion of the photoelectric conversion portion PD.

The second vertical reflection structure 34 may include a material having a refractive index lower than that of the substrate 1. In particular, the second vertical reflection structure 34 may include an oxide-based or nitride-based material. For example, the second vertical reflection structure 34 may include an insulating material such as a silicon oxide layer, a silicon nitride layer, and/or a silicon oxynitride layer. In addition, the second vertical reflection structure 34 may include a high-k dielectric material therein. The high-k dielectric material may be hafnium oxide (HfO$_2$), tantalum oxide (Ta$_2$O$_5$), or aluminum oxide (Al$_2$O$_3$). The second vertical reflection structure 34 may include the same material as the deep device isolation portion DTI and/or the first vertical reflection structure 32. Alternatively, the material of the second vertical reflection structure 34 may be different from the material of the deep device isolation portion DTI and/or the material of the first vertical reflection structure 32.

An anti-reflection layer 42 may be provided on the second surface 1b of the substrate 1. The anti-reflection layer 42 may cover the second surface 1b of the substrate 1, a top surface of the deep device isolation portion DTI, a top surface of the first vertical reflection structure 32, and a top surface of the second vertical reflection structure 34. For example, the anti-reflection layer 42 may be formed of a silicon nitride layer. The anti-reflection layer 42 may directly contact each of the deep device isolation portion DTI, a top surface of the first vertical reflection structure 32, a top surface of the second vertical reflection structure 34, and the second surface 1b of the substrate 1.

A color filter 44 may be provided on the anti-reflection layer 42. In other words, the anti-reflection layer 42 may be disposed between the color filter 44 and the second surface 1b of the substrate 1. The color filter 44 may be disposed on each of the unit pixel regions UP. The color filter 44 may be configured to transmit light, having a specific wavelength, of incident light LD. In some embodiments, a grid structure may be disposed within the color filters 44 and may be vertically aligned with the deep device isolation portion DTI. In some embodiments, the grid structure may include a stacked grid having a metal framework surrounded by a dielectric material. In some embodiments, a layer of a dielectric material and a stacked grid may have the same dielectric material (e.g., silicon oxide ($SiO_x$)).

A micro lens 46 may be provided on the color filter 44. In other words, the color filter 44 may be disposed between the micro lens 46 and the anti-reflection layer 42. The micro lens 46 may be disposed on each of the unit pixel regions UP. In some embodiments, the micro lens 46 may have a curved upper surface. The micro lens 46 may have a substantially flat bottom surface adjacent to the color filter 44 and the curved upper surface. The curved upper surface may be configured to focus the incident light LD on a center of each of the unit pixel regions UP when viewed in a plan view.

The incident light LD may be focused on an upper portion of the second vertical reflection structure 34. The incident light LD may penetrate the second vertical reflection structure 34 and may be scattered through a plurality of paths. The scattered incident light LD may be reflected a plurality of times at an inner side surface of the first vertical reflection structure 32. Alternatively, the scattered incident light LD may be reflected a plurality of times at the inner side surface of the first vertical reflection structure 32 and at a side surface of the second vertical reflection structure 34 as illustrated in FIG. 3B.

Since the first vertical reflection structure 32 and the second vertical reflection structure 34 are disposed inside the photoelectric conversion portion PD when viewed in a plan view, the incident light LD may be concentrated to the photoelectric conversion portion PD disposed in each of the unit pixel regions UP.

In an CMOS image sensor 100 according to the exemplary embodiments of the present inventive concept, the depths of the first and/or second vertical reflection structures 32 and 34 may be greater than the depth of the deep device isolation portion DTI, and the first and second vertical reflection structures 32 and 34 may be located on the photoelectric conversion portion PD. Therefore, multi-reflection of the scattered incident light LD may be induced to increase an optical path, and thus quantum efficiency by the incident light LD may increase and prevent cross-talk. Cross-talk occurs when scattered incident light LD leaks into adjacent other unit pixel regions UP. As a result, the exemplary embodiments of the present inventive concept may improve sensing the sensitivity of light (e.g., infrared light).

In addition, the exemplary embodiments of the present inventive concept may eliminate the need to increase the depth of the deep device isolation portion DTI, process difficulty and a process cost may be reduced.

Figure 4:
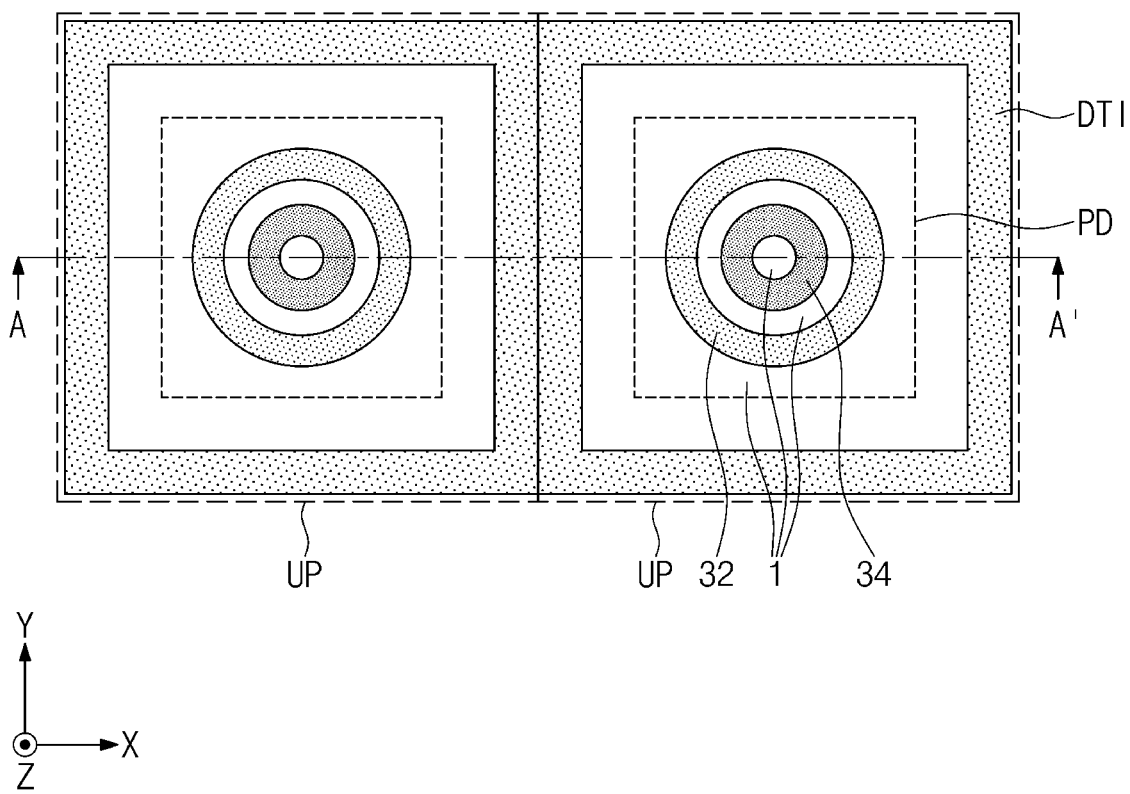
FIG. 4 is a plan view illustrating a CMOS image sensor according to an exemplary embodiment of the present inventive concept.
Figure 5A:
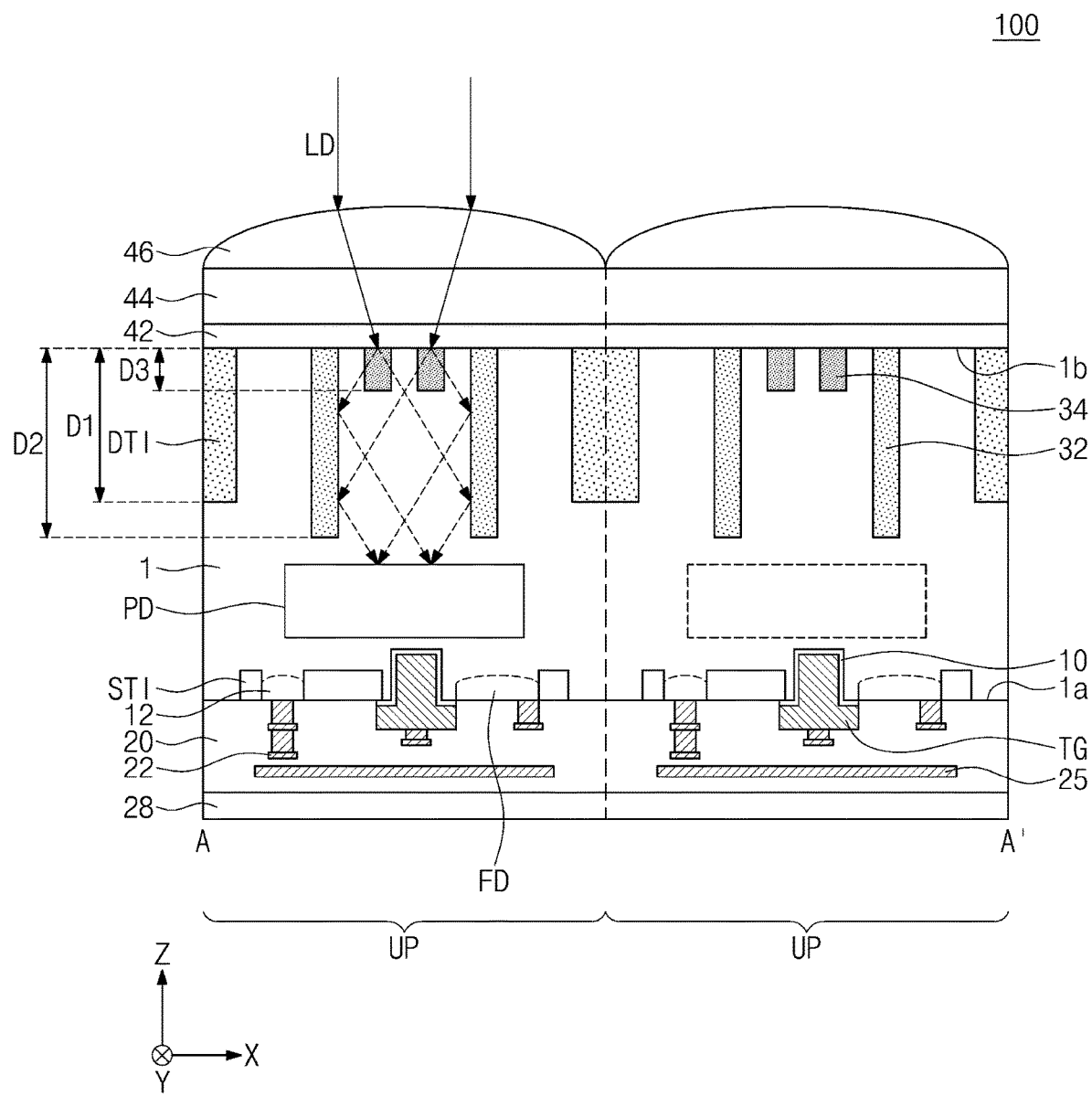
FIGS. 5A and 5B are cross-sectional views taken along a line A-A' of FIG. 4 illustrating the CMOS image sensor according to an exemplary embodiment of the present inventive concept.
Figure 5B:
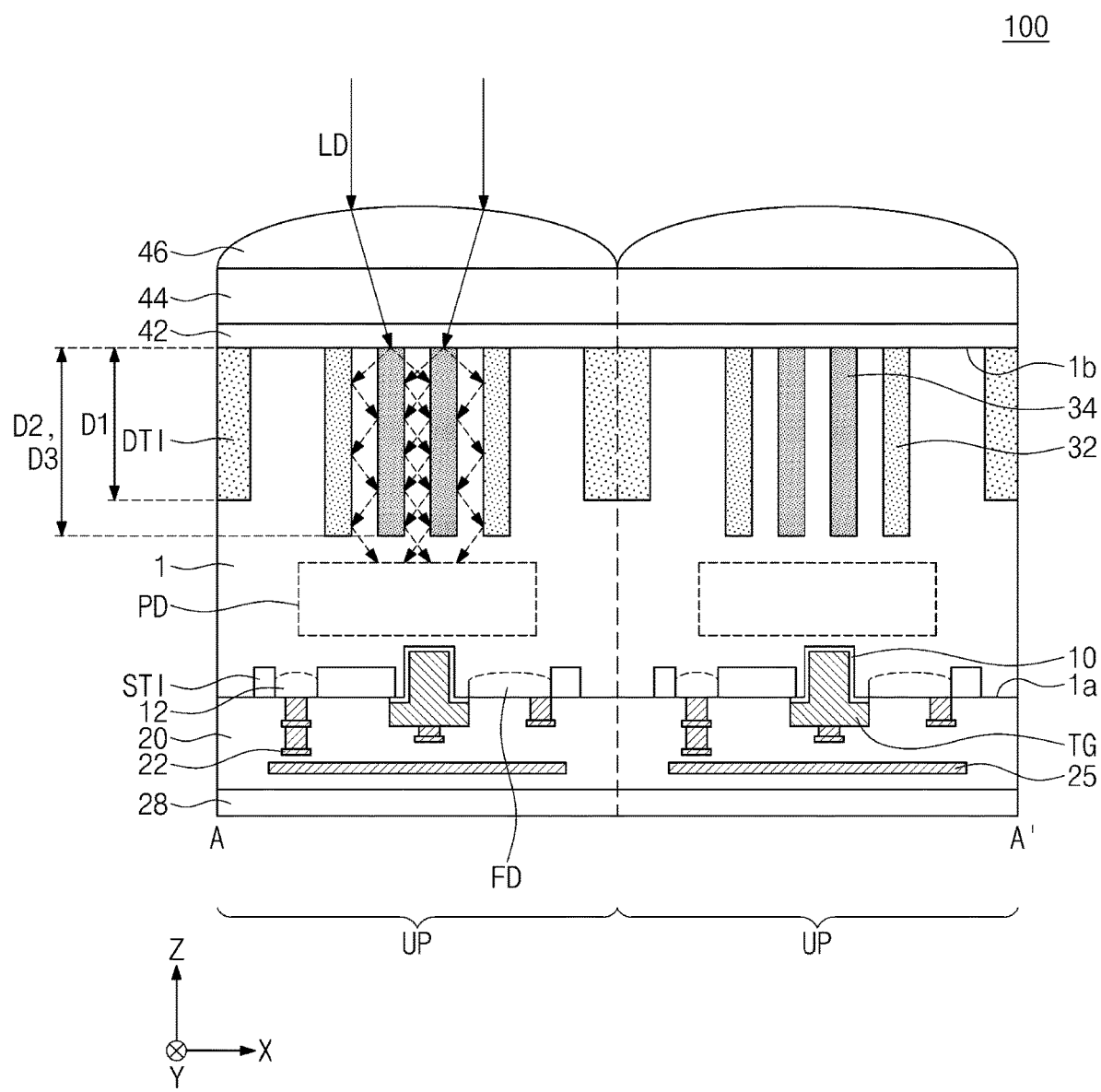

FIG. 4 is a plan view illustrating a CMOS image sensor according to an exemplary embodiment of the present inventive concept. FIGS. 5A and 5B are cross-sectional views taken along a line A-A' of FIG. 4 illustrating CMOS image sensors according to an exemplary embodiment of the present inventive concept. Hereinafter, the descriptions to the same components and features as mentioned with reference to FIGS. 2, 3A and 3B will be omitted for the purpose of ease and convenience in explanation.

Referring to FIGS. 4, 5A, and 5B, a second vertical reflection structure 34 may have a circular ring shape, an elliptical ring shape, or a polygonal ring shape when viewed in a plan view. In other words, the second surface 1b of the substrate 1 may be exposed in a central portion inside the second vertical reflection structure 34 when viewed in a plan view. The second vertical reflection structure 34 may be coaxial with the first vertical reflection structure 32.

Figure 6:
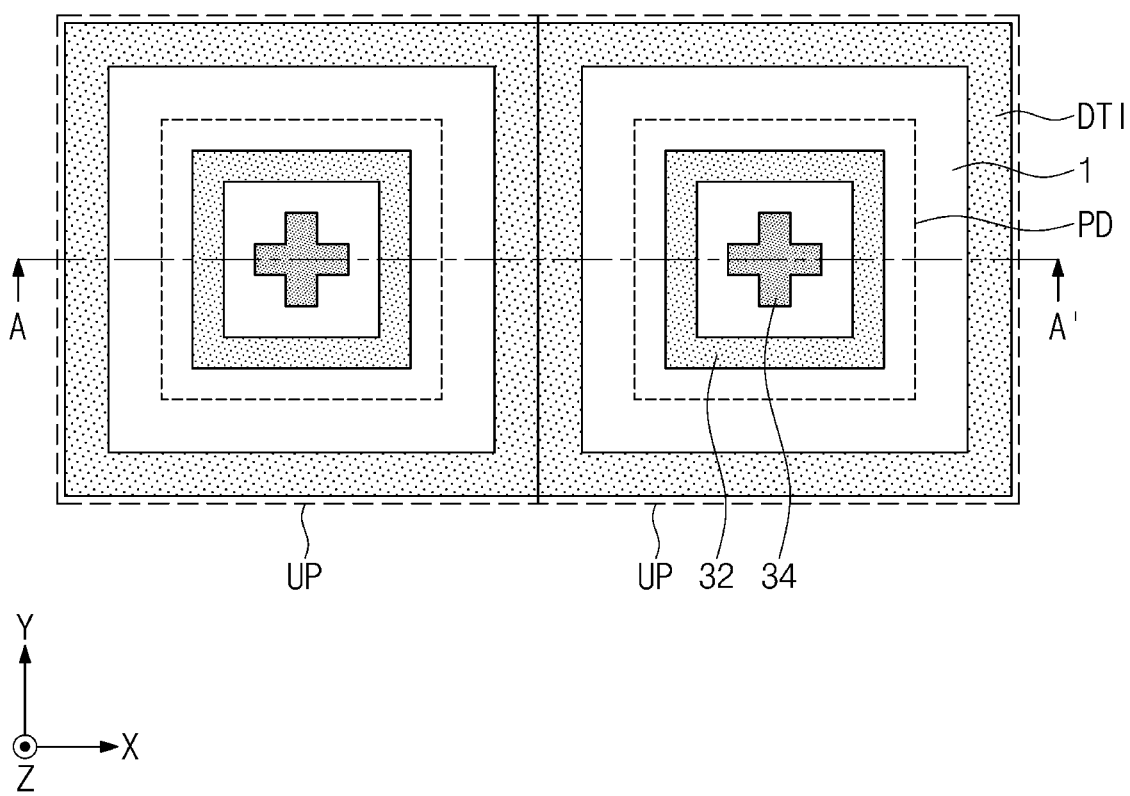
FIG. 6 is a plan view illustrating a CMOS image sensor according to an exemplary embodiment of the present inventive concept.

FIG. 6 is a plan view illustrating a CMOS image sensor according to an exemplary embodiment of the present inventive concept. Hereinafter, the descriptions to the same components and features as mentioned with reference to FIGS. 2, 3A and 3B will be omitted for the purpose of ease and convenience in explanation.

Referring to FIG. 6, a second vertical reflection structure 34 may have a cross shape or an X-shape in a central region of each of the unit pixel regions UP when viewed in a plan view. In addition, the first vertical reflection structure 32 may have a square shape and surround the second vertical reflection structure 34. A cross-sectional view taken along a line A-A' of FIG. 6 may be similar to FIG. 3A or FIG. 3B. In some cases, in a cross-sectional view taken along a line A-A' of FIG. 6, the length of the second vertical reflection structure 34 in the first direction X may be greater than the length of the second vertical reflection structure 34 in the first direction X illustrated in FIGS. 3A and 3B.

Figure 7:
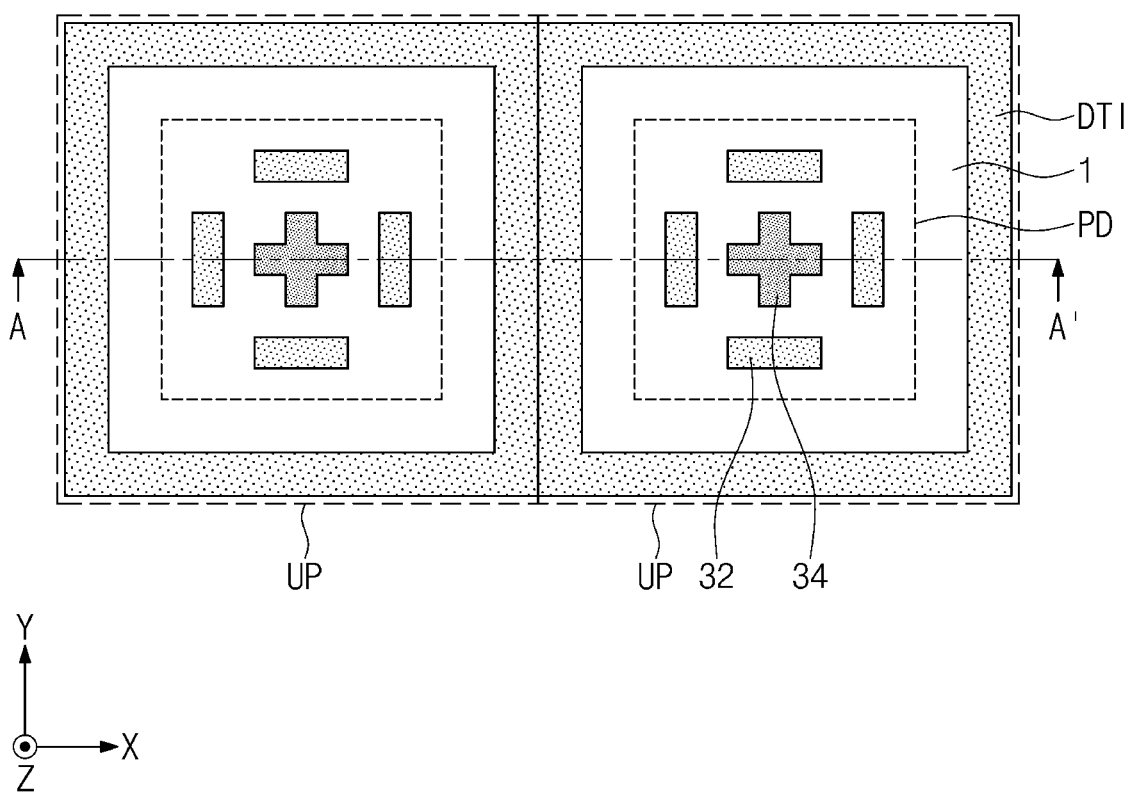
FIG. 7 is a plan view illustrating a CMOS image sensor according to an exemplary embodiment of the present inventive concept.

FIG. 7 is a plan view illustrating a CMOS image sensor according to an exemplary embodiment of the present inventive concept. Hereinafter, the descriptions to the same components and features as mentioned with reference to FIGS. 2, 3A and 3B will be omitted for the purpose of ease and convenience in explanation.

Referring to FIG. 7, a plurality of first vertical reflection structures 32 may be provided in each of the unit pixel regions UP. The first vertical reflection structures 32 may be spaced apart from each other. In other words, the first vertical reflection structures 32 may not be continuously connected to each other. The second vertical reflection structure 34 may be surrounded by the plurality of the first vertical reflection structures 32. However, portions of the second vertical reflection structure 34 may be exposed by the plurality of the first vertical reflection structures 32. A cross-sectional view taken along a line A-A' of FIG. 7 may be similar to FIG. 3A or FIG. 3B. In some cases, in a cross-sectional view taken along a line A-A' of FIG. 7, the length of the second vertical reflection structure 34 in the first direction X may be greater than the length of the second vertical reflection structure 34 in the first direction X illustrated in FIGS. 3A and 3B.

Figure 8:
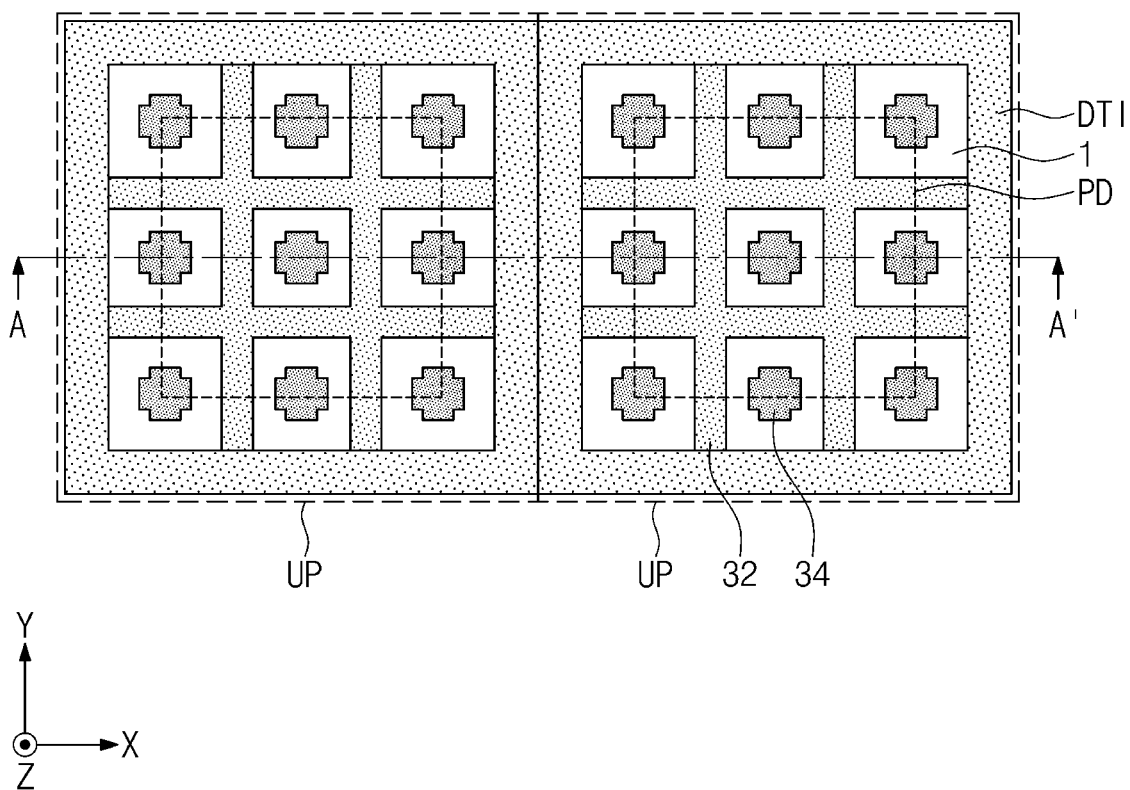
FIG. 8 is a plan view illustrating a CMOS image sensor according to an exemplary embodiment of the present inventive concept.
Figure 9A:
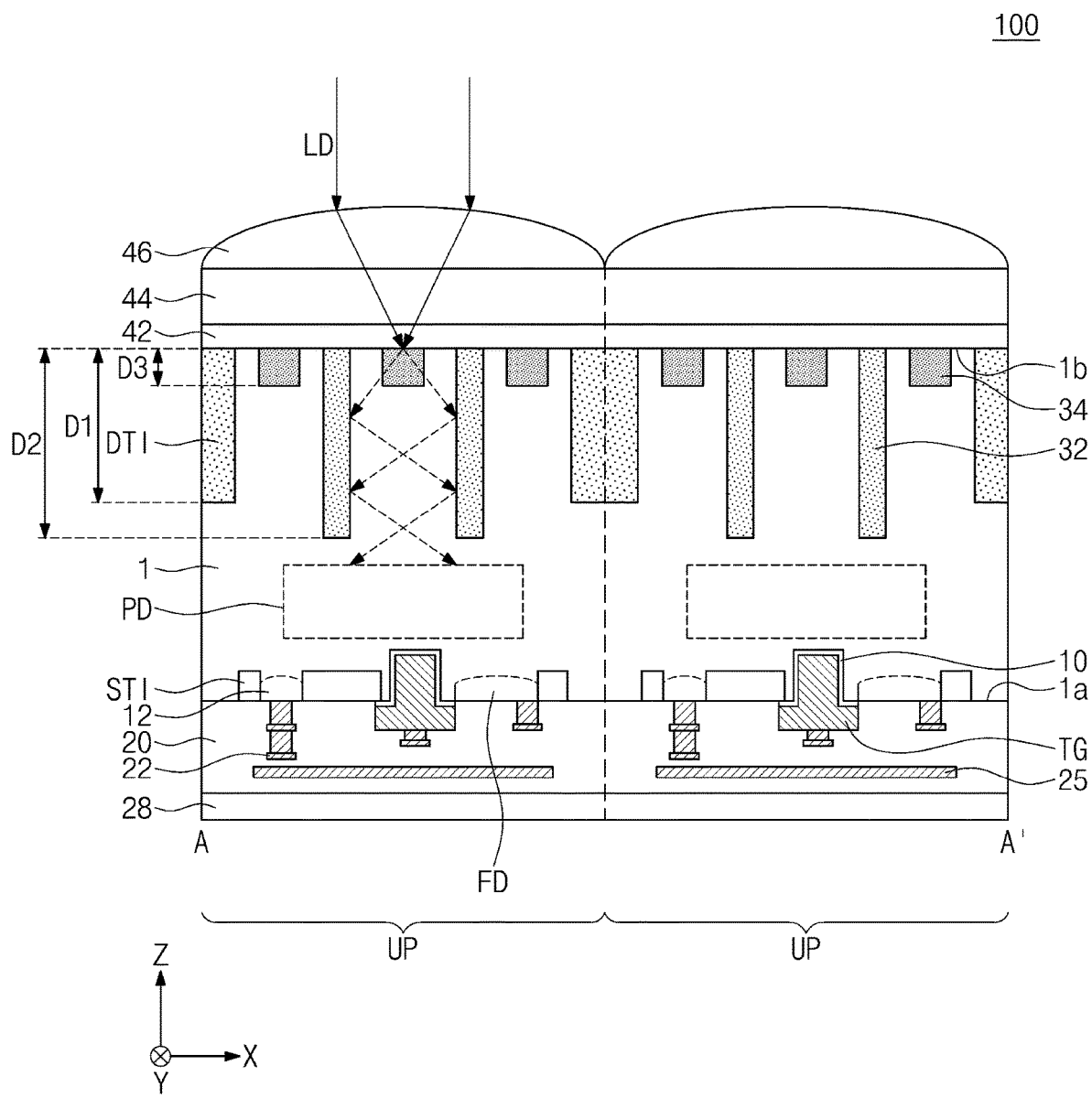
FIGS. 9A and 9B are cross-sectional views taken along a line A-A' of FIG. 8 illustrating the CMOS image sensor according to an exemplary embodiment of the present inventive concept.
Figure 9B:
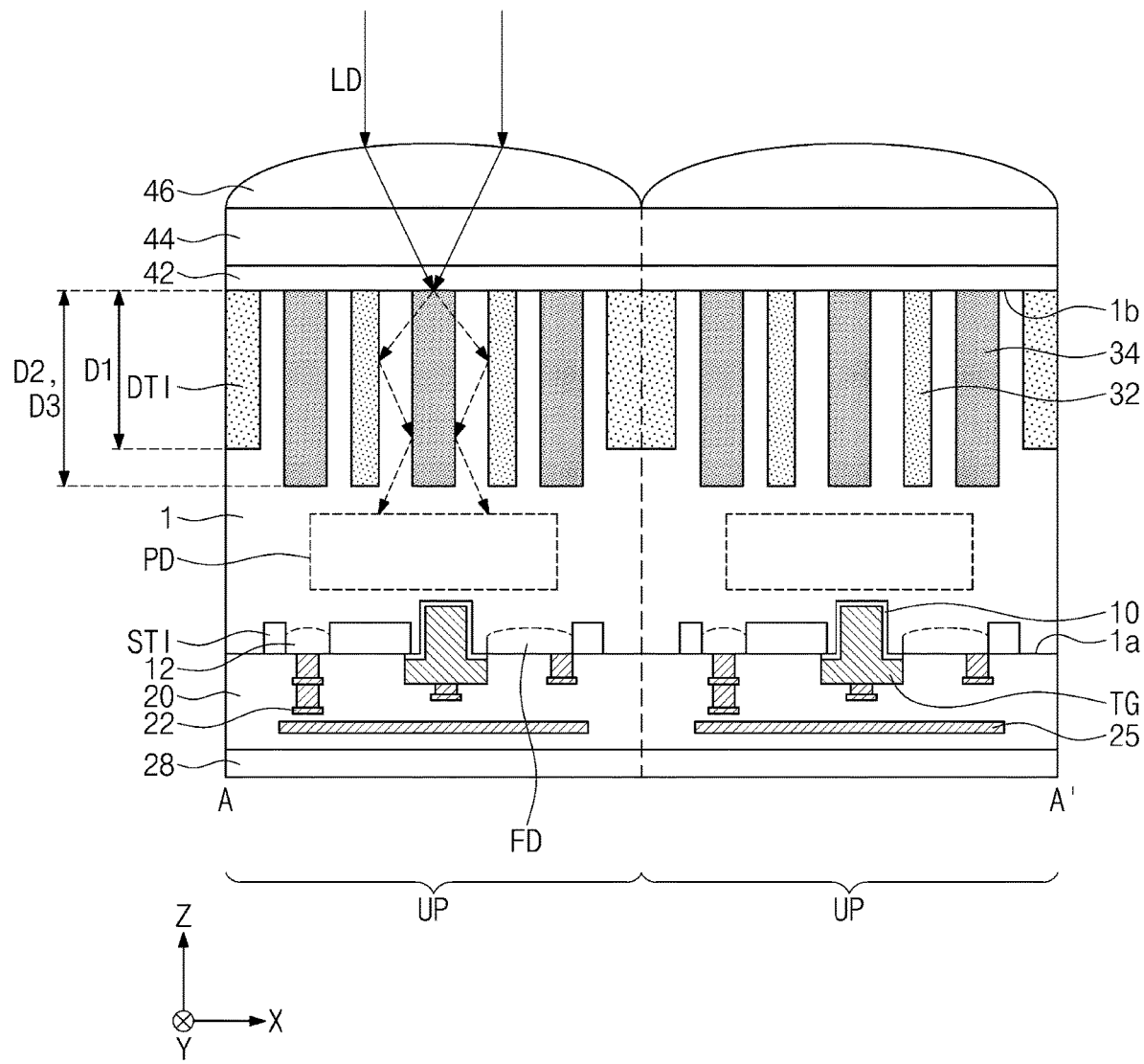

FIG. 8 is a plan view illustrating a CMOS image sensor according to an exemplary embodiment of the present inventive concept. FIGS. 9A and 9B are cross-sectional views taken along a line A-A' of FIG. 8 illustrating the CMOS image sensors according to an exemplary embodiment of the present inventive concept. Hereinafter, the descriptions to the same components and features as mentioned with reference to FIGS. 2, 3A and 3B will be omitted for the purpose of ease and convenience in explanation.

Referring to FIGS. 8, 9A and 9B, a first vertical reflection structure 32 may have a grid-shaped structure in each of the unit pixel regions UP when viewed in a plan view. Each of a plurality of second vertical reflection structures 34 may be provided in each of the openings of the grid-shaped first vertical reflection structure 32, respectively, when viewed in a plan view. The second vertical reflection structure 34 disposed in a central region of the grid-shaped structure may be surrounded by the first vertical reflection structure 32. The second vertical reflection structures 34 disposed in an outer region of the grid-shaped first vertical reflection structure 32 may be surrounded by the first vertical reflection structure 32 and the deep device isolation portion DTI.

In some embodiments, the second surface 1b of the substrate 1 may be disposed between the first vertical reflection structure 32 and the second vertical reflection structure 34, when viewed in a plan view. In other words, the substrate 1 may be disposed between the first vertical reflection structure 32 and the second vertical reflection structure 34, when viewed in a plan view. Similarly, the second vertical reflection structures 34 disposed in an outer region of the grid-shaped first vertical reflection structure 32 are surrounded by the first vertical reflection structure 32 and the deep device isolation portion DTI, when viewed in a plan view. The substrate 1 may be disposed between the second vertical reflection structures 34, and the first vertical reflection structure 32 and the deep device isolation portion DTI, when viewed in the plan view.

Figure 10:
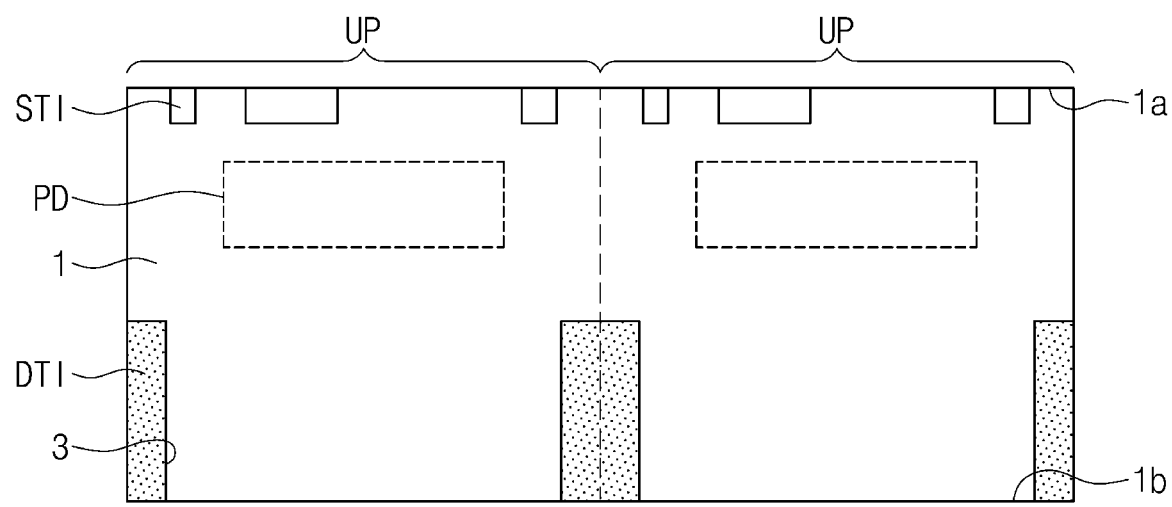
FIGS. 10, 11, and 12 are cross-sectional views illustrating a method of manufacturing the CMOS image sensor having the cross section illustrated in FIG. 3A.
Figure 10:
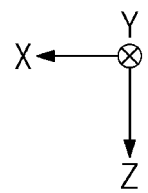
Figure 11:
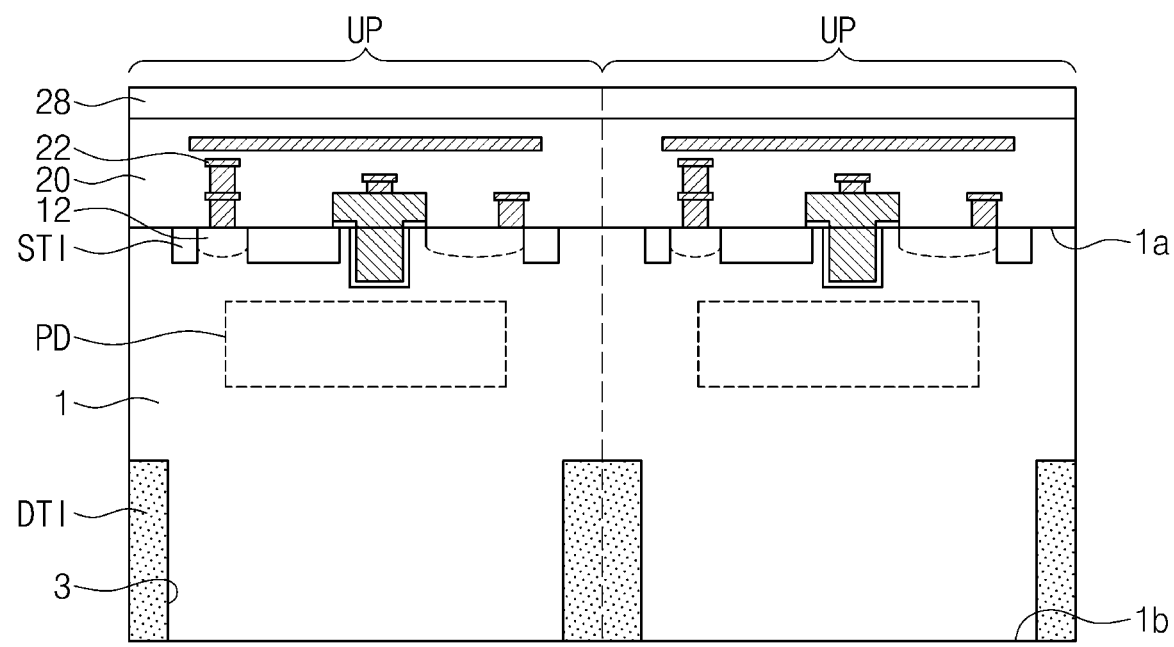
Figure 11:
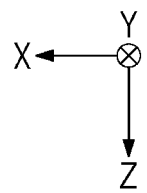
Figure 12:
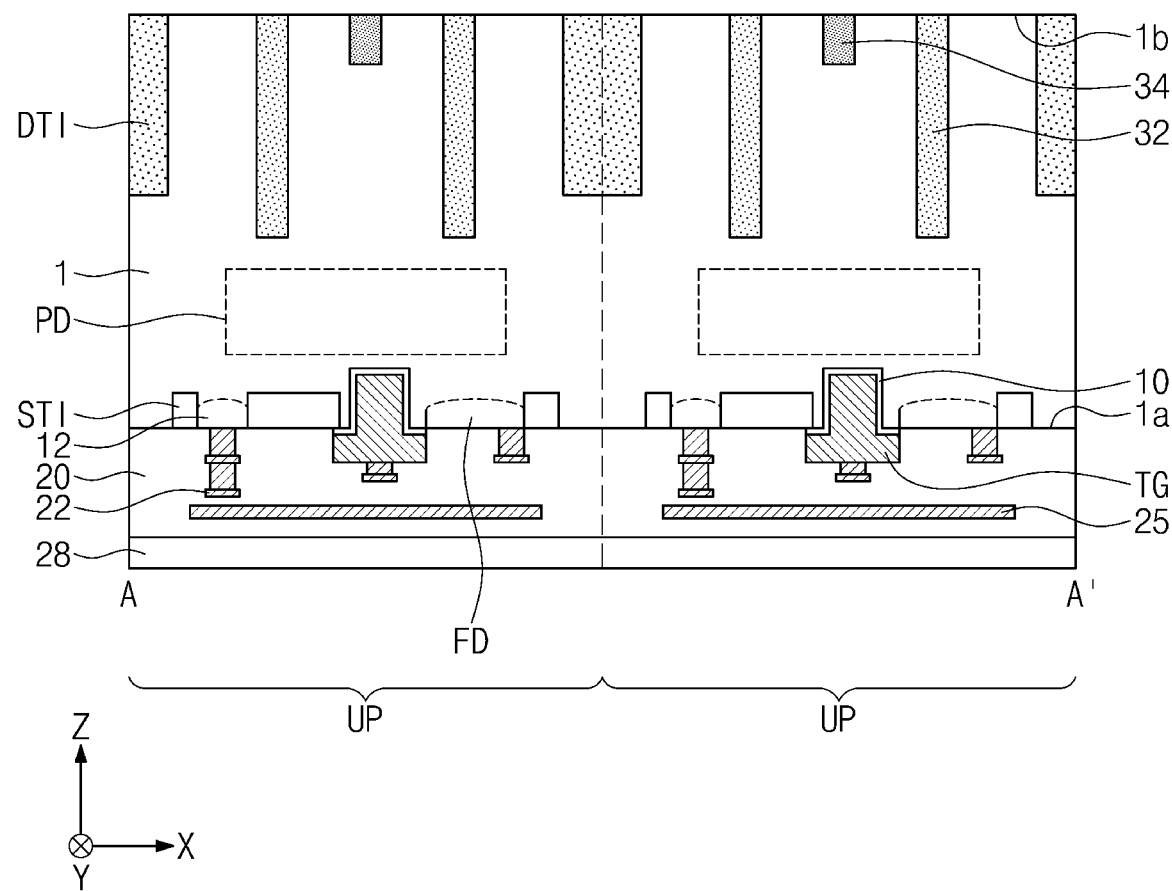

FIGS. 10, 11, and 12 are cross-sectional views illustrating a method of manufacturing the CMOS image sensor having the cross section illustrated in FIG. 3A.

Referring to FIG. 10, dopants may be injected into a substrate 1 of each of unit pixel regions UP by an ion implantation process to form a photoelectric conversion portion PD. A shallow device isolation layer STI may be formed adjacent to a first surface 1a of the substrate 1 to define active regions. A portion of the substrate 1 may be removed to form a shallow trench, and the shallow trench may be filled with a filling insulation layer to form the shallow device isolation layer STI.

Referring to FIG. 11, a portion of the substrate 1 exposed by the shallow device isolation layer STI may be etched to form a recessed region. A thermal oxidation process or a deposition process may be performed to form a gate insulating layer 10 conformally covering an inner surface of the recessed region and a portion of the first surface 1a of the substrate 1. A conductive layer may be stacked to fill the recessed region and then may be patterned to form a transfer gate TG. When the transfer gate TG is formed, gates having other functions may also be formed. Ion implantation processes may be performed to form a floating diffusion region FD and a ground region 12. Multi-layered interconnection lines 22, contact plugs, and a reflection portion 25 may be disposed in an interlayer insulating layer 20. The interlayer insulating layer 20 may be formed on the first surface 1a of the substrate 1. In addition, a passivation layer 28 may be formed on the interlayer insulating layer 20. The passivation layer 28 may be formed of a silicon nitride layer or polyimide.

Referring to FIG. 12, the substrate 1 may be turned over in such a way that a second surface 1b of the substrate 1 faces upward. A deep device isolation portion DTI extending from the second surface 1b of the substrate 1 toward the first surface 1a of the substrate 1 may be formed in the substrate 1 to isolate the unit pixel regions UP from each other. Accordingly, the deep device isolation portion DTI may be spaced apart by a distance from the first surface 1a of the substrate. The substrate 1 may be etched to form a deep trench and an insulating material may be formed to fill the deep trench. As a result, a planarization process may be performed on the insulating material to form the deep device isolation portion DTI.

A first photoresist pattern may be formed on the second surface 1b of the substrate 1, and an etching process may be performed to etch a portion of the substrate 1, in which a first vertical reflection structure 32 may be formed. Thereafter, the first photoresist pattern may be removed by a strip process, and then, a deposition process may be performed. Subsequently, a planarization process may be performed to form the first vertical reflection structure 32. Next, a second photoresist pattern may be formed on the second surface 1b of the substrate 1, and an etching process may be performed to etch a portion of the substrate 1, in which a second vertical reflection structure 34 will be formed. Thereafter, the second photoresist pattern may be removed by a strip process, and then, a deposition process may be performed. Subsequently, a planarization process may be performed to form the second vertical reflection structure 34. In some embodiments, the second vertical reflection structure 34 may be first formed, and then, the first vertical reflection structure 32 may be formed. Alternatively, in some embodiments, the first vertical reflection structure 32 and the second vertical reflection structure 34 may be formed at the same time. For example, the etching process may be a dry etching process. For example, the deposition process may be performed using an atomic layer deposition (ALD) method, a chemical vapor deposition (CVD) method, or a physical vapor deposition (PVD) method.

Referring back to FIG. 3A, an anti-reflection layer 42, a color filter 44 and a micro lens 46 may be sequentially formed on the second surface 1b of the substrate 1. The color filter 44 may be formed on the anti-reflection layer 42. The micro lens 46 may be formed on the color filter 44. Thus, the CMOS image sensor 100 may be manufactured.

Figure 13A:
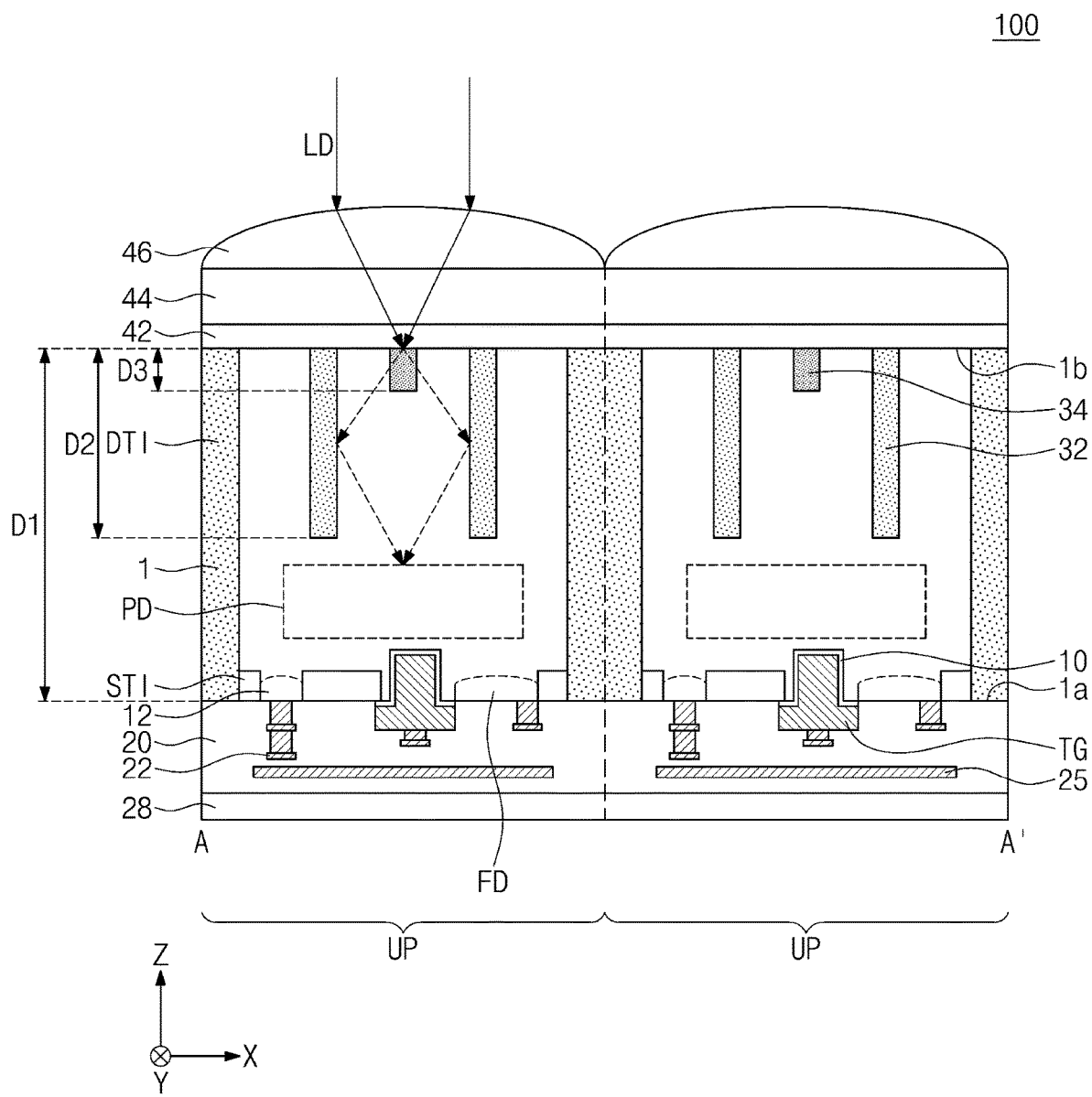
FIGS. 13A and 13B are cross-sectional views taken along the line A-A' of FIG. 2 illustrating the CMOS image sensor according to an exemplary embodiment of the present inventive concept.
Figure 13B:
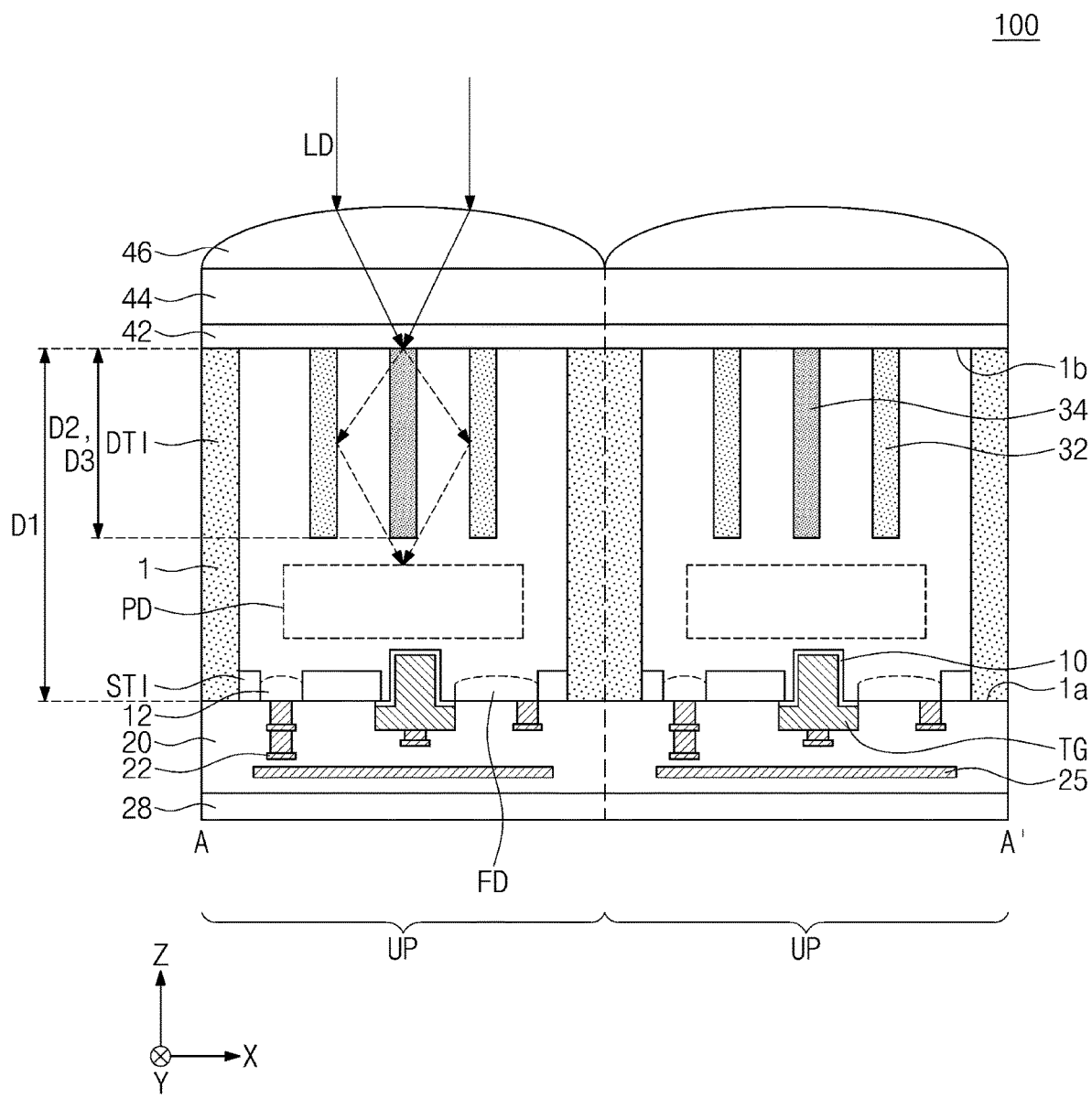

FIGS. 13A and 13B are cross-sectional views taken along the line A-A' of FIG. 2 illustrating CMOS image sensors according to an exemplary embodiment of the present inventive concept. Hereinafter, the descriptions to the same components and features as mentioned with reference to FIGS. 2, 3A and 3B will be omitted for the purpose of ease and convenience in explanation.

Referring to FIGS. 13A and 13B, a first depth D1 of a deep device isolation portion DTI may be greater than the second depth D2 of the first vertical reflection structure 32 and the third depth D3 of the second vertical reflection structure 34. In some embodiments, a bottom surface of the deep device isolation portion DTI may be in contact with the first surface 1a of the substrate 1. In other words, the first depth D1 of the deep device isolation portion DTI may extend from the second surface of the substrate 1 to the first surface 1a of the substrate 1. In some embodiments, a top surface of the deep device isolation portion DTI may be spaced apart from the second surface 1b of the substrate 1.

According to the CMOS image sensor of the present inventive concept, the depths of the first and second vertical reflection structures may be greater than the depth of the deep device isolation portion, and the first and second vertical reflection structures may be located inside the photoelectric conversion element when viewed in a plan view. Thus, multi-reflection of scattered light may be induced to increase an optical path, thereby increasing quantum efficiency, and preventing cross-talk, which occurs when incident or scattered light leaks into adjacent other unit pixel regions. As a result, the exemplary embodiments of the present inventive concept improve sensing sensitivity of light (e.g., infrared light).

In addition, since there is no need to increase the depth of the deep device isolation portion, a process difficulty and a process cost may be reduced.

While exemplary embodiments of the present inventive concept have been particularly shown and described, it will be understood by one of ordinary skill in the art that variations in form and detail may be made therein without departing from the spirit and scope of the attached claims.

What is claimed is:

1. A CMOS image sensor comprising:
a substrate including a plurality of unit pixel regions, the substrate including:
a first surface configured to receive light;
a second surface opposite to the first surface;
a deep device isolation portion disposed in the substrate and configured to isolate the plurality of unit pixel regions from each other, wherein the deep device isolation portion extends from the first surface toward the second surface and has a first depth measured from the first surface;
a photoelectric conversion portion formed in the substrate in each of the plurality of unit pixel regions; and
a first vertical reflection structure disposed in each of the plurality of unit pixel regions of the substrate and surrounded by the deep device isolation portion in a plan view,
wherein the first vertical reflection structure extends from the first surface toward the second surface and has a second depth measured from the first surface,
wherein the second depth is equal to or greater than the first depth, and
wherein a bottommost surface of the first vertical reflection structure is higher than an uppermost portion of the photoelectric conversion portion with respect to the first surface.

2. The CMOS image sensor of claim 1, further comprising:
a second vertical reflection structure disposed in each of the plurality of unit pixel regions and surrounded by the first vertical reflection structure in the plan view,
wherein a bottommost surface of the second vertical reflection structure is higher than the uppermost portion of the photoelectric conversion portion with respect to the first surface.

3. The CMOS image sensor of claim 2, wherein the first vertical reflection structure has a circular ring shape, an elliptical ring shape, or a polygonal ring shape when viewed in the plan view,
wherein the second vertical reflection structure has a circular shape, an elliptical shape, or a polygonal shape when viewed in the plan view, and
wherein the first vertical reflection structure is coaxial with the second vertical reflection structure.

4. The CMOS image sensor of claim 2, wherein the second vertical reflection structure extends from the first surface toward the second surface and has a third depth measured from the first surface, and
wherein the third depth is equal to or greater than the first depth.

5. The CMOS image sensor of claim 2, wherein each of the first vertical reflection structure and the second vertical reflection structure has the same circular ring shape, elliptical ring shape, or polygonal ring shape when viewed in the plan view, and
wherein the first vertical reflection structure is coaxial with the second vertical reflection structure.

6. The CMOS image sensor of claim 5, wherein the second vertical reflection structure has a third depth from the first surface, and
wherein the third depth is equal to or greater than the first depth.

7. The CMOS image sensor of claim 1, wherein the first vertical reflection structure has a grid-shaped structure when viewed in the plan view.

8. The CMOS image sensor of claim 7, further comprising:
a plurality of second vertical reflection structures, wherein each of the second vertical reflection structures is disposed in each opening of the first vertical reflection structure when viewed in the plan view.

9. The CMOS image sensor of claim 1, wherein the first vertical reflection structure is provided in plurality in each of the plurality of the unit pixel regions, the CMOS image sensor further comprising:
a second vertical reflection structure surrounded by the plurality of first vertical reflection structures when viewed in the plan view,
wherein the plurality of first vertical reflection structures are spaced apart from each other.

10. The CMOS image sensor of claim 1, wherein the first vertical reflection structure includes a material having a refractive index lower than that of the substrate.

11. The CMOS image sensor of claim 10, wherein the first vertical reflection structure includes a silicon oxide layer, a silicon nitride layer, or a silicon oxynitride layer.

12. A CMOS image sensor comprising:
a substrate including a plurality of unit pixel regions, the substrate including:
a first surface;
a second surface opposite to the first surface and configured to receive light;
a deep device isolation portion disposed in the substrate and configured to isolate the plurality of unit pixel regions from each other;
a photoelectric conversion portion formed in the substrate in each of the plurality of unit pixel regions;
a first vertical reflection structure disposed in each of the plurality of unit pixel regions in the substrate and surrounded by the deep device isolation portion in a plan view; and
a second vertical reflection structure disposed in each of the plurality of unit pixel regions and surrounded by the first vertical reflection structure in the plan view,
wherein the deep device isolation portion is spaced apart from the first surface, and
wherein the first vertical reflection structure and the second vertical reflection structure are disposed inside the photoelectric conversion portion when viewed in the plan view.

13. The CMOS image sensor of claim 12, wherein the deep device isolation portion has a first depth measured from the second surface,
wherein the first vertical reflection structure has a second depth measured from the second surface, and
wherein the second depth is equal to or greater than the first depth.

14. The CMOS image sensor of claim 13, wherein the first vertical reflection structure has a circular ring shape, an elliptical ring shape, or a polygonal ring shape when viewed in the plan view, and
wherein the second vertical reflection structure has a circular shape, an elliptical shape, or a polygonal shape when viewed in the plan view, and wherein the first vertical reflection structure is coaxial with the second vertical reflection structure.

15. The CMOS image sensor of claim 14, wherein the second vertical reflection structure has a third depth measured from the second surface, and
wherein the third depth is equal to or greater than the first depth.

16. The CMOS image sensor of claim 13, wherein each of the first vertical reflection structure and the second vertical reflection structure has the same circular ring shape, elliptical ring shape, or polygonal ring shape when viewed in the plan view, and
wherein the first vertical reflection structure is coaxial with the second vertical reflection structure.

17. The CMOS image sensor of claim 16, wherein the second vertical reflection structure has a third depth measured from the second surface, and
wherein the third depth is equal to or greater than the first depth.

18. The CMOS image sensor of claim 12, wherein the first vertical reflection structure and the second vertical reflection structure include a material having a refractive index lower than that of the substrate.

19. A CMOS image sensor comprising:
a substrate including a plurality of unit pixel regions, the substrate including;
a first surface;
a second surface opposite to the first surface and configured to receive light;
a deep device isolation portion disposed in the substrate and configured to isolate the plurality of unit pixel regions from each other;
a photoelectric conversion portion formed in the substrate in each of the plurality of unit pixel regions;
a first vertical reflection structure disposed in the substrate and surrounded by the deep device isolation portion in a plan view;
a second vertical reflection structure disposed in the substrate and surrounded by the first vertical reflection structure in the plan view;
a transfer gate and a floating diffusion region disposed on the first surface;
an interlayer insulating layer disposed on the first surface, wherein the interlayer insulating layer covers the first surface, the transfer gate, and the floating diffusion region; and
interconnection lines disposed in the interlayer insulating layer,
wherein the deep device isolation portion extends from the second surface toward the first surface and has a first depth measured from the second surface,
wherein the first vertical reflection structure extends from the second surface toward the first surface and has a second depth measured from the second surface,
wherein the second depth is equal to or greater than the first depth, and
wherein a level of a bottommost surface of the first vertical reflection structure and a level of a bottommost surface of the second vertical reflection structure are higher than a level of an uppermost portion of the photoelectric conversion portion.

20. The CMOS image sensor of claim 19, wherein the second vertical reflection structure extends from the second surface toward the first surface and has a third depth measured from the second surface, and
wherein the third depth is equal to or greater than the first depth.

* * * * *